(12) United States Patent
Ok et al.

(10) Patent No.: US 10,658,495 B2
(45) Date of Patent: May 19, 2020

(54) VERTICAL FIN TYPE BIPOLAR JUNCTION TRANSISTOR (BJT) DEVICE WITH A SELF-ALIGNED BASE CONTACT

(71) Applicant: INTERNATIONAL BUSINESS MACHINES CORPORATION, Armonk, NY (US)

(72) Inventors: Injo Ok, Loudonville, NY (US); Choonghyun Lee, Rensselaer, NY (US); Soon-Cheon Seo, Glenmont, NY (US); Sungjae Lee, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 16/157,928

(22) Filed: Oct. 11, 2018

(65) Prior Publication Data

US 2020/0119170 A1 Apr. 16, 2020

(51) Int. Cl.

| | |
|---|---|
| *H01L 29/73* | (2006.01) |
| *H01L 29/08* | (2006.01) |
| *H01L 29/66* | (2006.01) |
| *H01L 29/205* | (2006.01) |
| *H01L 29/225* | (2006.01) |
| *H01L 21/324* | (2006.01) |
| *H01L 21/477* | (2006.01) |
| *H01L 21/02* | (2006.01) |

(Continued)

(52) U.S. Cl.
CPC ........ *H01L 29/737* (2013.01); *H01L 29/0817* (2013.01); *H01L 29/0821* (2013.01); *H01L 29/165* (2013.01); *H01L 29/66242* (2013.01); *H01L 21/02296* (2013.01); *H01L 21/324* (2013.01); *H01L 21/3242* (2013.01); *H01L 21/477* (2013.01)

(58) Field of Classification Search
CPC .................................................. H01L 29/737
See application file for complete search history.

(56) References Cited

U.S. PATENT DOCUMENTS

| | | |
|---|---|---|
| 5,583,059 A | 12/1996 | Burghartz |
| 5,625,206 A * | 4/1997 | Chandrasekhar ... H01L 29/7371 257/197 |
| 6,905,935 B1 | 6/2005 | Gau et al. |

(Continued)

*Primary Examiner* — Julio J Maldonado
*Assistant Examiner* — Omar F Mojaddedi
(74) *Attorney, Agent, or Firm* — Tutunjian & Bitetto, P.C.; Vazken Alexanian

(57) ABSTRACT

A method of forming a silicon-germanium heterojunction bipolar transistor (hbt) device is provided. The method includes forming a stack of four doped semiconductor layers on a semiconductor substrate. The method further includes forming a dummy emitter contact and contact spacers on a fourth doped semiconductor layer of the stack of four doped semiconductor layers, and removing portions of the second, third, and fourth semiconductor layers to form a vertical fin. The method further includes recessing the second and fourth doped semiconductor layers, and depositing a condensation layer on the second, third, and fourth doped semiconductor layers. The method further includes reacting the condensation layer with the third doped semiconductor layer to form a protective segment on a condensed protruding portion.

14 Claims, 10 Drawing Sheets

(51) Int. Cl.
*H01L 29/737* (2006.01)
*H01L 29/165* (2006.01)

(56) References Cited

U.S. PATENT DOCUMENTS

| | | |
|---|---|---|
| 7,964,893 B2 | 6/2011 | Lee |
| 7,985,959 B2 | 7/2011 | Magistretti et al. |
| 8,293,598 B2 | 10/2012 | Pellizzer et al. |
| 8,809,905 B2 | 8/2014 | Lin et al. |
| 9,159,816 B2 | 10/2015 | Harame et al. |
| 9,263,336 B2 | 2/2016 | BrightSky et al. |
| 9,391,181 B2 | 7/2016 | Chu-Kung et al. |
| 9,673,294 B2 | 6/2017 | Tschumakow et al. |
| 2011/0186841 A1* | 8/2011 | Meunier-Bellard ......................... H01L 29/0821 257/51 |

* cited by examiner a dummy emitter contact and contact spacers on the fourth doped semiconductor layer, and removing portions of the first, second, third, and fourth semiconductor layers to form a vertical fin. The method further includes recessing the second doped semiconductor layer and fourth doped semiconductor layer, and depositing a condensation layer on the exposed surfaces of the second doped semiconductor layer, third doped semiconductor layer, and fourth doped semiconductor layer. The method further includes reacting the condensation layer with the third doped semiconductor layer to form a protective segment on a condensed protruding portion of the third doped semiconductor layer, and removing the condensation layer from the second doped semiconductor layer and fourth doped semiconductor layer.

VERTICAL FIN TYPE BIPOLAR JUNCTION TRANSISTOR (BJT) DEVICE WITH A SELF-ALIGNED BASE CONTACT

BACKGROUND

Technical Field

The present invention generally relates to heterojunction bipolar transistor (HBT) devices, and more particularly to a silicon-germanium HBT.

Description of the Related Art

A heterojunction bipolar transistor (HBT) is a type of bipolar junction transistor (BJT), where the HBT uses different semiconductor materials for the emitter and base regions of the transistor device that create a heterojunction, as compared to using the same semiconductor material for the emitter and base regions in the BJT. The base of an HBT device can be more highly doped. The current gain β of bipolar transistor devices is given as the ratio of the collector current to the base current, $I_C/I_B$.

The channel for the FinFET can be an upright slab of semiconductor material, commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a silicon-germanium heterojunction bipolar transistor (HBT) device is provided. The method includes forming a stack of four doped semiconductor layers on a semiconductor substrate. The method further includes forming a dummy emitter contact and contact spacers on a fourth doped semiconductor layer of the stack of four doped semiconductor layers. The method further includes removing portions of the second, third, and fourth semiconductor layers to form a vertical fin. The method further includes recessing the second doped semiconductor layer and fourth doped semiconductor layer, and depositing a condensation layer on the exposed surfaces of the second doped semiconductor layer, third doped semiconductor layer, and fourth doped semiconductor layer. The method further includes reacting the condensation layer with the third doped semiconductor layer to form a protective segment on a condensed protruding portion of the third doped semiconductor layer.

In accordance with another embodiment of the present invention, a method of forming a silicon-germanium heterojunction bipolar transistor (HBT) device is provided. The method includes forming a first doped semiconductor layer on a semiconductor substrate, and forming a second doped semiconductor layer on the first doped semiconductor layer, wherein the material of the second doped semiconductor layer is silicon. The method further includes forming a third doped semiconductor layer on the second doped semiconductor layer, wherein the material of the third doped semiconductor layer is silicon-germanium, and forming a fourth doped semiconductor layer on the third doped semiconductor layer, wherein the material of the fourth doped semiconductor layer is silicon. The method further includes forming In accordance with yet another embodiment of the present invention, a silicon-germanium heterojunction bipolar transistor (HBT) device is provided. The HBT device includes a shortened collector fin layer on a semiconductor substrate, and a base fin layer on the shortened collector fin layer, wherein the material of the base fin layer is silicon-germanium. The HBT device further includes a condensed protruding portion on each of the opposite ends of the base fin layer, wherein the condensed protruding portions are silicon-germanium with a greater germanium concentration than the base fin layer. The HBT device further includes a shortened emitter fin layer on the base fin layer, and a base contact in physical and electrical contact with one of the condensed protruding portions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a silicon-germanium (SiGe) heterojunction bipolar transistor (HBT) that overcomes the low mobility of similar silicon (Si) devices, and has low resistivity ohmic contacts to reduce the device's parasitic resistances. The increasing current densities of the SiGe HBT can put more emphasis on interconnects as a key factor in limiting transistor layout.

Embodiments of the present invention provide a self-aligned wrap-around-base-contact in extremely scaled Fin-shaped bipolar junction transistor (BJT) structures by fully utilizing Fermi level pining effect of Ge (or high SiGe) and metals. The vertical BJT can have a SiGe base and low contact resistance. The base layer can be as thin as possible without shorting the emitter and collector.

Embodiments of the present invention provide a method of fabricating a silicon-germanium (SiGe) HBT that uses a $GeO_2$ layer and a SiGe condensation reaction at an exposed side of a SiGe base layer to provide Ge condensation at a low temperature in an inert gas ambient. The condensation reaction can create a high germanium (Ge) concentration contact at the base layer with a silicon oxide protective segment on the condensed protruding portion of the base layer. A low temperature process can be used to avoid dopant and germanium diffusion. Si in the SiGe base layer can be selectively oxidized due to the lower Gibbs free energy.

Embodiments of the present invention provide a self-align base contact helping lateral and vertical scaling that are used to achieve smaller and faster SiGe HBT devices with greatly increased current densities. Improving both the cut off frequency, $f_T$, and the maximum frequency of oscillation, $f_{MAX}$, can be a significant challenge as the collector and base dopant concentrations are increased. The increasing current densities of the SiGe HBT put more emphasis on interconnects as a key factor in limiting transistor layout and performance.

Exemplary applications/uses to which the present invention can be applied include, but are not limited to: ultrafast circuits, such as radio-frequency (RF) systems, and in applications requiring a high power efficiency, such as RF power amplifiers in cellular phones.

It is to be understood that aspects of the present invention will be described in terms of a given illustrative architecture; however, other architectures, structures, substrate materials and process features and steps can be varied within the scope of aspects of the present invention.

Figure 1:
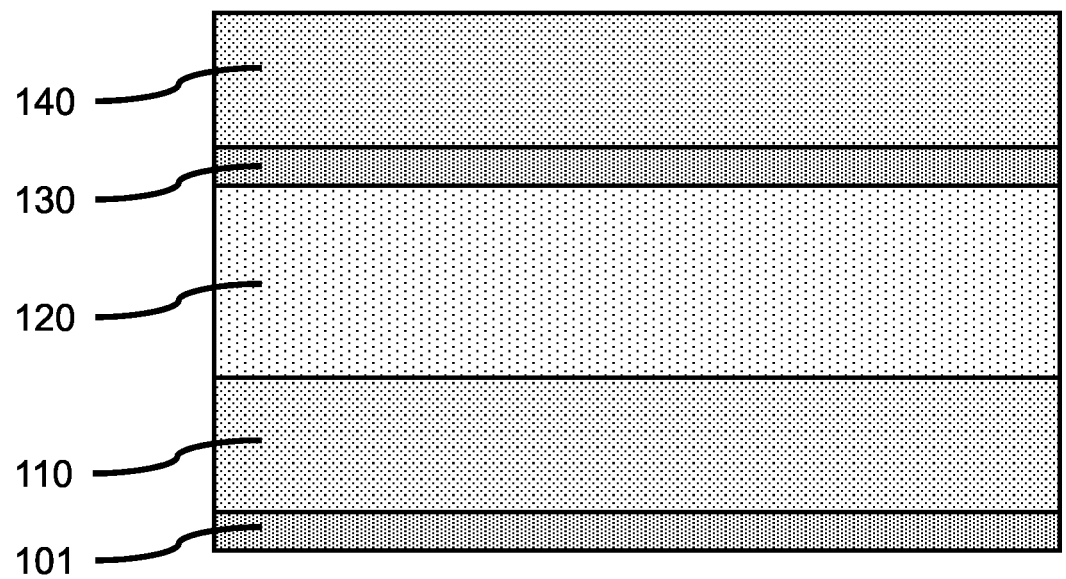
FIG. 1 is a cross-sectional side view showing a plurality of doped semiconductor layers on a substrate, in accordance with an embodiment of the present invention.

Referring now to the drawings in which like numerals represent the same or similar elements and initially to FIG. 1, a plurality of doped semiconductor layers on a substrate is shown, in accordance with an embodiment of the present invention.

In one or more embodiments, the substrate 101 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 101 or an active semiconductor layer can be a crystalline semiconductor, for example, a IV or IV-IV semiconductor (e.g., silicon (Si), silicon carbide (SiC), silicon-germanium (SiGe), germanium (Ge)) or a III-V semiconductor (e.g., gallium-arsenide (GaAs), indium-phosphide (InP), indium-antimonide (InSb)).

In one or more embodiments, a plurality of doped semiconductor layers can be formed on a substrate 101, where the doped semiconductor layers can be formed by implantation, epitaxial or heteroepitaxial growth, or a combination thereof. In various embodiments, a first doped semiconductor layer 110 can be formed by dopant implantation into an upper portion of a semiconductor substrate 101, and overlying doped semiconductor layers 120, 130, 140 can be formed by epitaxial or heteroepitaxial growth on the first doped semiconductor layer 110. In various embodiments, a second doped semiconductor layer 120 can be formed by dopant implantation into an upper portion of a semiconductor substrate 101, where the second doped semiconductor layer 120 can be closer to the surface of substrate 101 than the first doped semiconductor layer 110.

In one or more embodiments, the first doped semiconductor layer 110 can be a highly doped collector semiconductor layer formed by implantation of the n-type (e.g., phosphorus (P), arsenic (As)) or p-type (e.g., boron (B), gallium (Ga)) dopants into a semiconductor substrate 101.

In various embodiments, the first doped semiconductor layer 110 can have a dopant concentration in a range of about $1 \times 10^{18}/cm^3$ to about $1 \times 10^{20}/cm^3$, or about $1 \times 10^{18}/cm^3$ to about $1 \times 10^{19}/cm^3$, or about $1 \times 10^{19}/cm^3$ to about $1 \times 10^{20}/cm^3$, although other concentrations are also contemplated.

In one or more embodiments, the first doped semiconductor layer 110 can have a thickness in a range of about 10 nanometers (nm) to about 1000 nm, or about 10 nm to about 100 nm, or about 100 nm to about 1000 nm, although other thicknesses are also contemplated.

In one or more embodiments, the second doped semiconductor layer 120 can be a lightly doped collector semiconductor layer formed by implantation of the n-type (e.g., phosphorus (P), arsenic (As)) or p-type (e.g., boron (B), gallium (Ga)) dopants into a semiconductor substrate 101.

In various embodiments, the second doped semiconductor layer 120 can have a dopant concentration in a range of about $1 \times 10^{16}/cm^3$ to about $1 \times 10^{20}/cm^3$, or about $1 \times 10^{16}/cm^3$ to about $1 \times 10^{18}/cm^3$, or about $1 \times 10^{18}/cm^3$ to about $1 \times 10^{20}/cm^3$, where the dopant concentration of the second doped semiconductor layer 120 can be less than the dopant concentration of the first doped semiconductor layer 110.

In one or more embodiments, the second doped semiconductor layer 120 can have a thickness in a range of about 5 nm to about 500 nm, or about 5 nm to about 50 nm, or about 50 nm to about 500 nm, although other thicknesses are also contemplated.

The first doped semiconductor layer 110 and second doped semiconductor layer 120 can be the same semiconductor material and include the same dopant species, where a dopant concentration gradient can be controlled by the implantation parameters. In a non-limiting exemplary embodiment, the substrate can be single crystal silicon (Si), where the first doped semiconductor layer 110 is highly n-doped silicon having a dopant concentration of about $1 \times 10^{20}/cm^3$, and the second doped semiconductor layer 120 is lightly n-doped silicon having a dopant concentration of about $1 \times 10^{18}/cm^3$.

In one or more embodiments, a third doped semiconductor layer 130 can be formed on the second doped semiconductor layer 120, where the third doped semiconductor layer 130 can be a doped base layer. In various embodiments, the third doped semiconductor layer 130 can be formed by epitaxial or heteroepitaxial growth on the second doped semiconductor layer 120, for example, molecular beam epitaxy (MBE) or atomic layer epitaxy (ALE).

In one or more embodiments, the third doped semiconductor layer 130 can be a doped base layer formed on the doped collector layers, where the third doped semiconductor layer 130 can be doped in situ (i.e., during formation), ex situ (i.e., outside of formation), or both. In various embodiments, the third doped semiconductor layer 130 can be doped with n-type (e.g., phosphorus (P), arsenic (As)) or p-type (e.g., boron (B), gallium (Ga)) dopants, where the dopant type can be opposite the dopant type of the doped collector layers 110, 120 to form a p-n junction.

In various embodiments, the third doped semiconductor layer 130 can be silicon-germanium (SiGe) having a germanium concentration in a range of about 20 atomic percent (at. %) to about 80 at. %, or bout 40 at. % to about 60 at. %.

In various embodiments, the third doped semiconductor layer 130 can have a dopant concentration in a range of about $1 \times 10^{14}/cm^3$ to about $1 \times 10^{16}/cm^3$, or about $1 \times 10^{14}/cm^3$ to about $1 \times 10^{15}/cm^3$, or about $1 \times 10^{15}/cm^3$ to about $1 \times 10^{16}/cm^3$.

In one or more embodiments, the third doped semiconductor layer 130 can have a thickness in a range of about 1 nm to about 100 nm, or about 1 nm to about 10 nm, or about 10 nm to about 100 nm, although other thicknesses are also contemplated. The third doped semiconductor layer 130 can be sufficiently thin to form the base of a heterojunction bipolar transistor (HBT).

In one or more embodiments, a fourth doped semiconductor layer 140 can be formed on the third doped semiconductor layer 130, where the fourth doped semiconductor layer 140 can be formed by epitaxial or heteroepitaxial growth on the third doped semiconductor layer 130, for example, molecular beam epitaxy (MBE) or atomic layer epitaxy (ALE). The fourth doped semiconductor layer 140 can be a doped emitter layer for an HBT.

In one or more embodiments, the fourth doped semiconductor layer 140 can be a highly doped emitter semiconductor layer formed by incorporation of n-type (e.g., phosphorus (P), arsenic (As)) or p-type (e.g., boron (B), gallium (Ga)) dopants, where the dopant type can be opposite the dopant type of the doped base layer to form a second p-n junction.

In various embodiments, the fourth doped semiconductor layer 140 can have a dopant concentration in a range of about $1 \times 10^{17}/cm^3$ to about $1 \times 10^{20}/cm^3$, or about $1 \times 10^{17}/cm^3$ to about $1 \times 10^{18}/cm^3$, or about $1 \times 10^{18}/cm^3$ to about $1 \times 10^{20}/cm^3$.

In one or more embodiments, the fourth doped semiconductor layer 140 can have a thickness in a range of about 5 nm to about 500 nm, or about 5 nm to about 50 nm, or about 50 nm to about 500 nm, although other thicknesses are also contemplated. In a non-limiting exemplary embodiment, the third doped semiconductor layer 130 can be a p-type single crystal silicon-germanium layer having a dopant concentration of about $1 \times 10^{16}/cm^3$, and the fourth doped semiconductor layer 140 can be an n-type single crystal silicon layer having a dopant concentration of about $1 \times 10^{20}/cm^3$.

Figure 2:
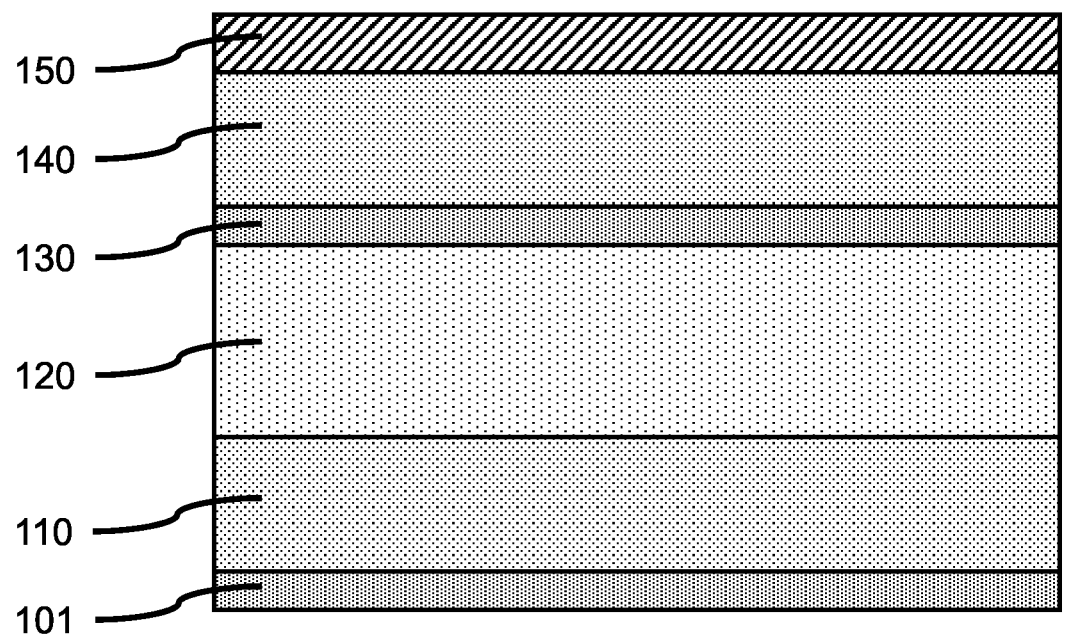
FIG. 2 is a cross-sectional side view showing a hard mask layer on the doped semiconductor layers, in accordance with an embodiment of the present invention.

FIG. 2 is a cross-sectional side view showing a hard mask layer on the doped semiconductor layers, in accordance with an embodiment of the present invention.

In one or more embodiments, a hard mask layer 150 can be formed on the fourth doped semiconductor layer 140 of the doped semiconductor layers 110, 120, 130, 140. The hard mask layer 150 can be formed by a blanket deposition, for example, by chemical vapor deposition (CVD) or plasma enhanced CVD (PECVD).

In various embodiments, the hard mask layer 150 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

Figure 3:
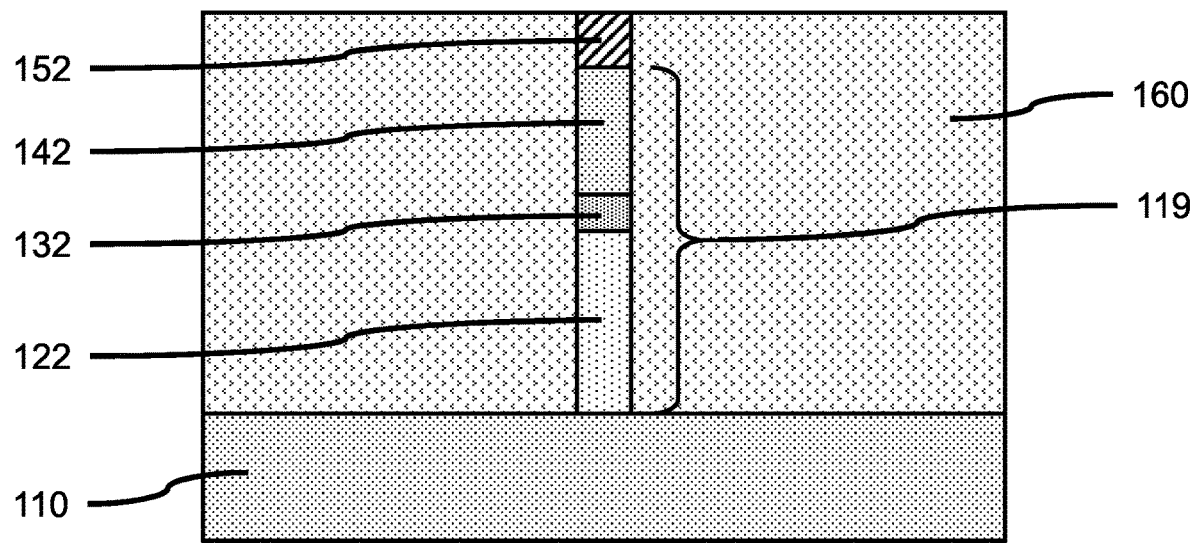
FIG. 3 is a cross-sectional side view, perpendicular to FIG. 2, showing a fill layer adjoining a patterned hard mask layer and patterned doped semiconductor layers, in accordance with an embodiment of the present invention.

FIG. 3 is a cross-sectional side view, perpendicular to FIG. 2, showing a fill layer adjoining a patterned hard mask layer and patterned doped semiconductor layers, in accordance with an embodiment of the present invention.

In one or more embodiments, the hard mask layer 150 can be can be patterned using lithographic techniques and etching to form a patterned hard mask layer, where the patterned hard mask layer can include one or more hard mask bars 152 remaining on the fourth doped semiconductor layer 140 from the hard mask layer 150. The patterned hard mask layer can be used to form one or more vertical fin(s) 119 from the second doped semiconductor layer 120, third doped semiconductor layer 130, and fourth doped semiconductor layer 140. The one or more vertical fin(s) 119 can be formed below each of the one or more hard mask bars 152 using a directional etch, for example, a timed reactive ion etch (RIE). In various embodiments, the parameters (e.g., pressure, bias voltage, and gas exposure switching) of the RIE can be tuned to control the etch depth to avoid etching into the first doped semiconductor layer 110 forming the highly doped collector layer. The combination of photoresist/hardmask material(s) and RIE parameters can also provide controlled etch selectivity and depth control.

In various embodiments, the one or more hard mask bars 152 and underlying patterned fourth doped layer 142, patterned third doped layer 132, and patterned first doped semiconductor layer 122 can have a thickness in a range of about 5 nm to about 12 nm, or about 6 nm to about 10 nm, although other widths are also contemplated.

In one or more embodiments, a fill layer 160 can be formed on the exposed surface of the first doped semiconductor layer 110 and adjoining the patterned doped semiconductor layers 122, 132, 142, where the fill layer 160 can be a dielectric material, including, but not limited to, silicon oxide (SiO) or a low-k material. A low-k dielectric material can include, but not be limited to, carbon doped silicon oxide (SiO:C), fluorine doped silicon oxide (SiO:F), a polymeric material, for example, tetraethyl orthosilicate (TEOS), hydrogen silsesquioxane (HSQ) and methylsilsesquioxane (MSQ), and combinations thereof. The fill layer 160 can be formed by, for example, CVD, PECVD, a spin-on process, and combinations thereof.

Figure 4:
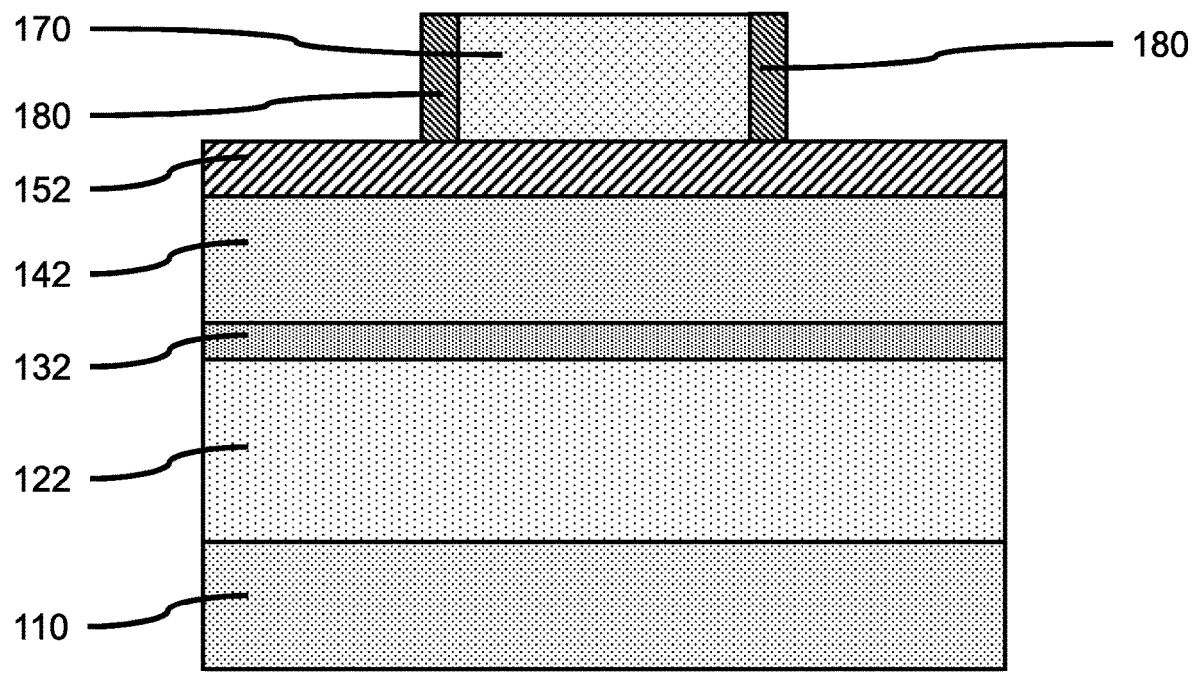
FIG. 4 is a cross-sectional side view showing a dummy emitter contact and contact spacers formed on the patterned hard mask layer and patterned doped semiconductor layers, in accordance with an embodiment of the present invention.

FIG. 4 is a cross-sectional side view showing a dummy emitter contact and contact spacers formed on the patterned hard mask layer and patterned doped semiconductor layers, in accordance with an embodiment of the present invention.

In one or more embodiments, a dummy emitter layer can be formed on the fill layer 160 and one or more hard mask bars 152, and patterned to form a dummy emitter contact 170 on each of the hard mask bars 152. In various embodiments, the dummy emitter contact 170 can be a material that can be selectively removable from the fill layer 160 and hard mask bars 152, for example, a dielectric or semiconductor material, including, but not limited to, amorphous carbon (a-C), carbon doped silicon oxide (SiO:C), amorphous silicon (a-Si), and silicon-germanium (SiGe).

In one or more embodiments, a contact spacer layer can be formed on the dummy emitter contact 170, where the contact spacer layer can be formed can be formed by a conformal deposition, for example, atomic layer deposition (ALD) plasma enhanced ALD (PEALD), low pressure chemical vapor deposition (LPCVD), or a combination thereof. A selective directional etch (e.g., RIE) can be used to remove portions of the contact spacer layer on surfaces perpendicular to the direction of the ion beam, while leaving contact spacers 180 on the sidewalls of the dummy emitter contact 170. In various embodiments, the contact spacer layer and contact spacers 180 can be a dielectric material (e.g., SiO, SiN, SiON, etc.).

Figure 5:
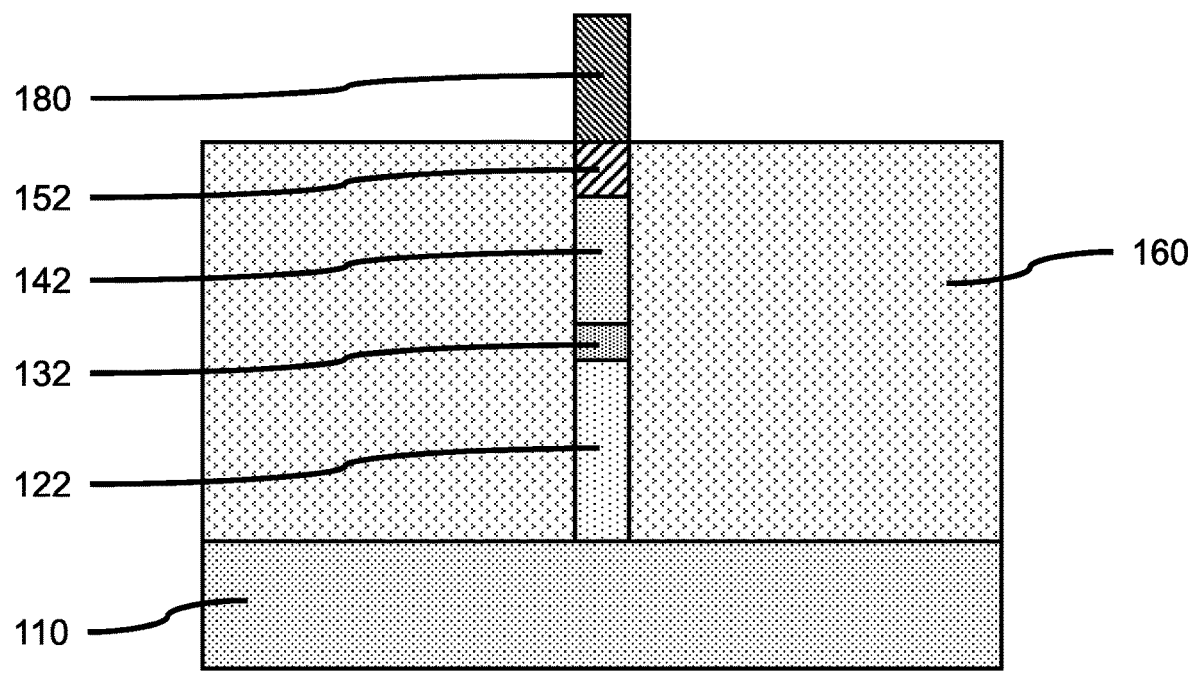
FIG. 5 is a cross-sectional side view, perpendicular to FIG. 4, showing a contact spacer on the patterned hard mask layer and patterned doped semiconductor layers, in accordance with an embodiment of the present invention.

FIG. 5 is a cross-sectional side view, perpendicular to FIG. 4, showing a contact spacer on the patterned hard mask layer and patterned doped semiconductor layers, in accordance with an embodiment of the present invention.

In one or more embodiments, the contact spacers 180 and dummy emitter contact 170 can be formed on the hard mask bars 152 and above the top surface of the fill layer 160.

Figure 6:
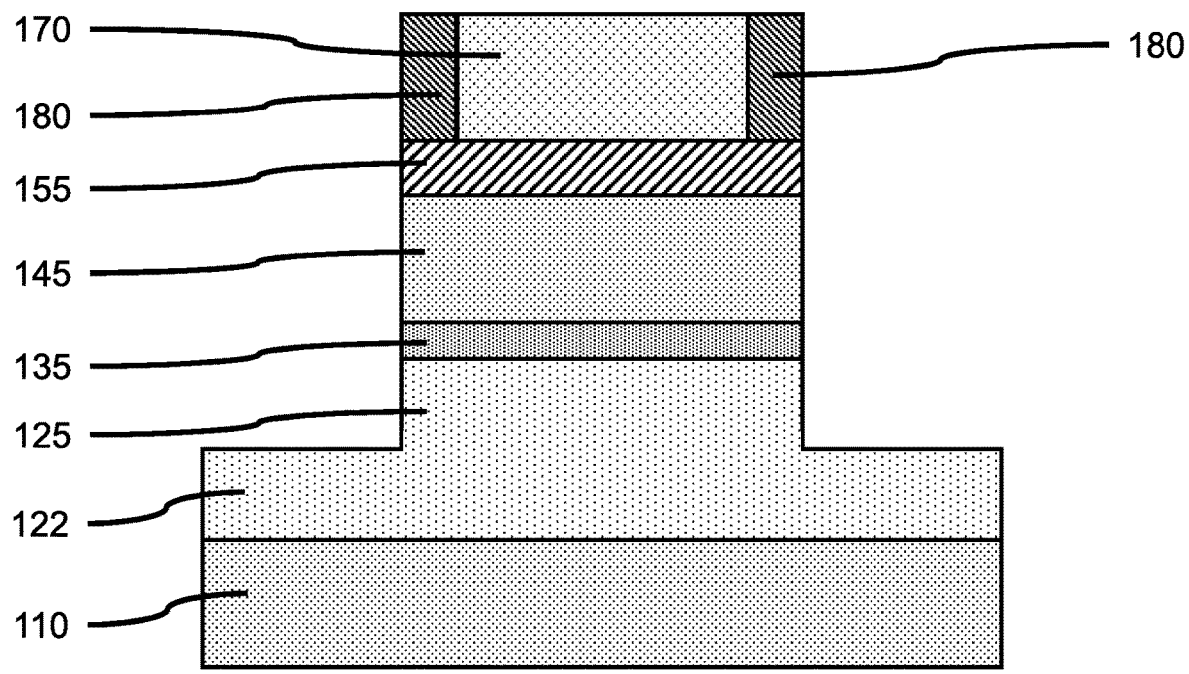
FIG. 6 is a cross-sectional side view of the long axis of the vertical fin showing a dummy emitter contact and contact spacers formed on a fin template and patterned vertical fin layers, in accordance with an embodiment of the present invention.

FIG. 6 is a cross-sectional side view of the long axis of the vertical fin showing a dummy emitter contact and contact spacers formed on a fin template and patterned vertical fin layers, in accordance with an embodiment of the present invention.

In one or more embodiments, the contact spacers 180 and dummy emitter contact 170 can act as a mask for a selective directional etch (e.g., RIE) to form a fin template 155 from the hard mask bars 152, an emitter fin layer 145 from the patterned fourth doped layer 142, a base fin layer 135 from the patterned third doped layer 132, and a collector fin layer 125 from a portion of the patterned second doped semiconductor layer 122. The collector fin layer 125 can be on a remaining portion of the patterned second doped semiconductor layer 122. In various embodiments, the collector fin layer 125 can have a height in a range of about 10 nm to about 100 nm, or about 30 nm to about 60 nm. In various embodiments, the fin template 155, emitter fin layer 145, base fin layer 135, and collector fin layer 125 can have a length of about 100 nm to about 1000 nm, or about 200 nm to about 500 nm, although other lengths are contemplated.

Figure 7:
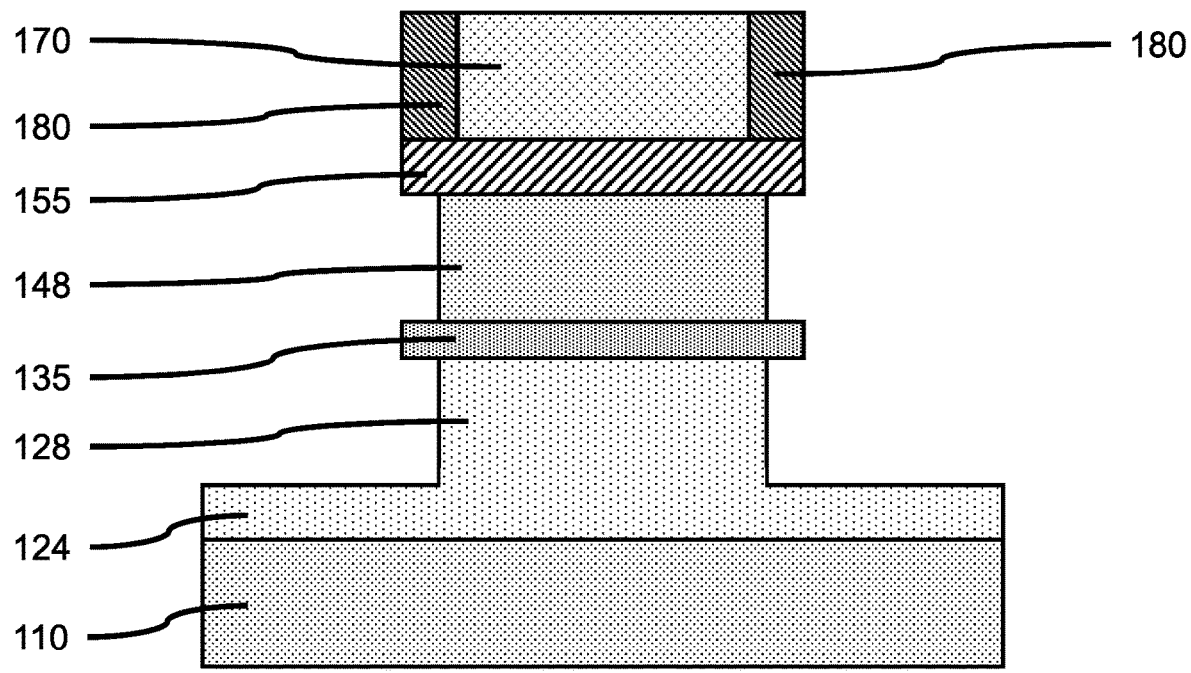
FIG. 7 is a cross-sectional side view showing a recessed emitter fin layer and recessed collector fin layer on opposite sides of a base fin layer, in accordance with an embodiment of the present invention.

FIG. 7 is a cross-sectional side view showing a recessed emitter fin layer and recessed collector fin layer on opposite sides of a base fin layer, in accordance with an embodiment of the present invention.

In one or more embodiments, portions of the emitter fin layer 145 and collector fin layer 125 can be recessed to reduce the length of the emitter fin layer 145 and collector fin layer 125, while the base fin layer 135 remains the same to form protruding portions that extend beyond the end walls of the emitter fin layer and collector fin layer. The emitter fin layer 145 and collector fin layer 125 can be recessed using a selective isotropic etch, for example, a wet chemical etch or dry plasma etch to form recessed emitter fin layer 148 and recessed collector fin layer 128. The fill layer 160 on opposite sides of the fin template 155, emitter fin layer 145, base fin layer 135, and collector fin layer 125 can prevent the narrowing of the layers by protecting the sidewalls during the recessing process. In various embodiments, the emitter fin layer 145 and collector fin layer 125 can be recessed by about 10 nm to about 50 nm, or about 20 nm to about 35 nm. The height of the exposed portion of the patterned first doped semiconductor layer 122 can be reduced by about the same amount as the recess distance to form a reduced first doped semiconductor layer 124.

Figure 8:
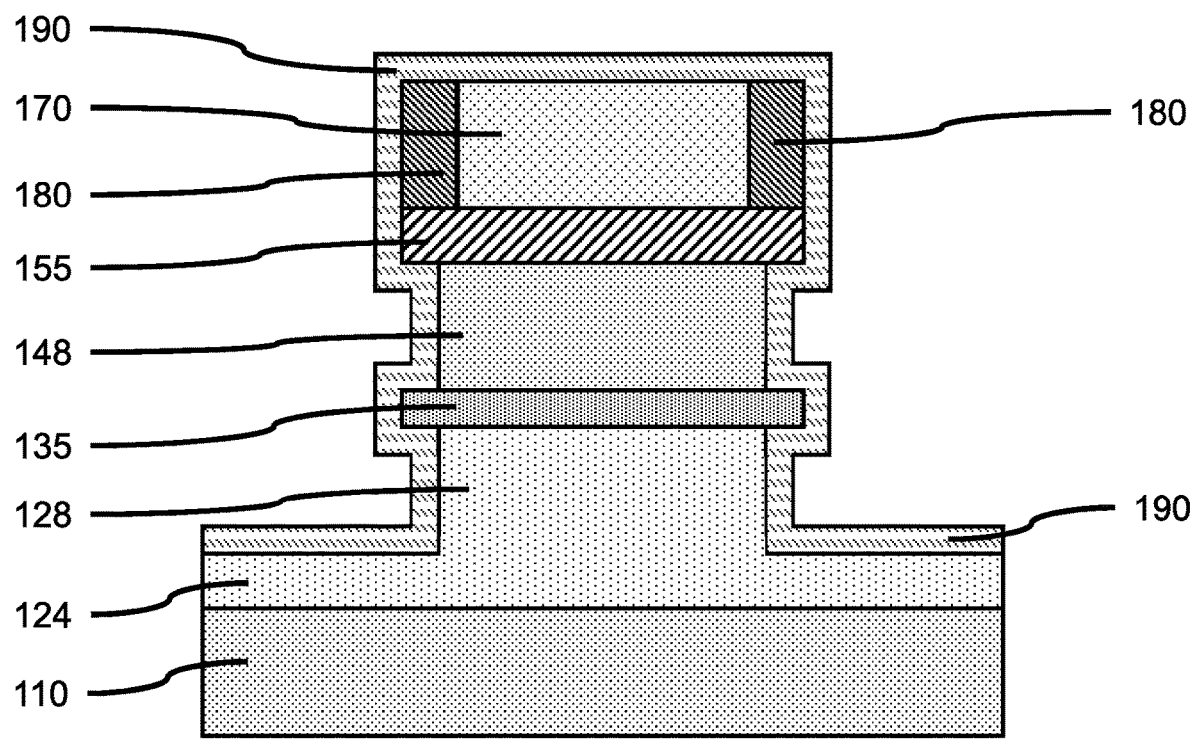
FIG. 8 is a cross-sectional side view of the long axis of the vertical fin showing a condensation layer formed on the exposed surfaces of the contact spacers, fin template, recessed emitter fin layer, and recessed collector fin layer, and on protruding portions of the base fin layer, in accordance with an embodiment of the present invention.

FIG. 8 is a cross-sectional side view of the long axis of the vertical fin showing a condensation layer formed on the exposed surfaces of the contact spacers, fin template, recessed emitter fin layer, and recessed collector fin layer, and on protruding portions of the base fin layer, in accordance with an embodiment of the present invention.

In one or more embodiments, a condensation layer 190 can be formed on the exposed surfaces of the contact spacers 180, dummy emitter contact 170, fin template 155, recessed emitter fin layer 148, base fin layer 135, recessed collector fin layer 128, and reduced first doped semiconductor layer 124. In various embodiments, the condensation layer 190 can be a material that can react with the material of the base fin layer 135. The condensation layer 190 can be germanium oxide (GeO), for example stoichiometric $GeO_2$.

In various embodiments, the condensation layer 190 can have a thickness in a range of about 2 nm to about 6 nm, or about 3 nm to about 5 nm, where the thickness of the condensation layer 190 can provide sufficient germanium to increase the germanium concentration of the entire protruding portions of the base fin layer 135.

Figure 9:
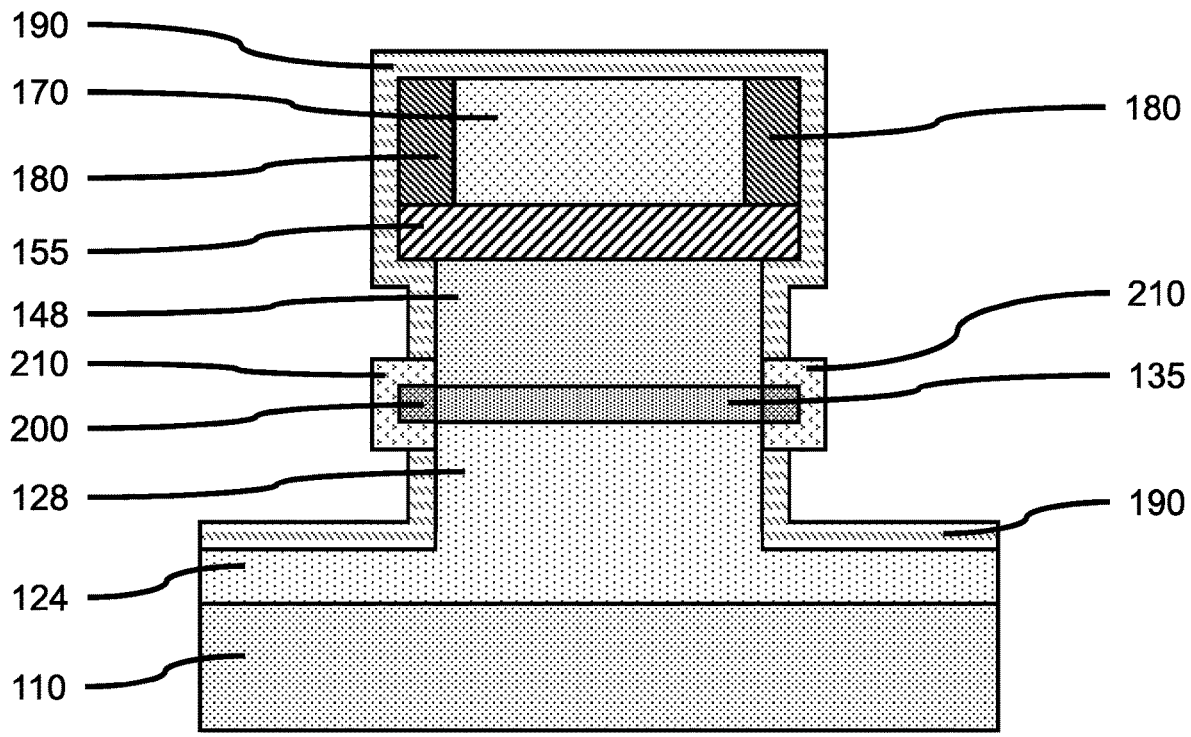
FIG. 9 is a cross-sectional side view of the long axis of the vertical fin showing a protective segment formed on a condensed protruding portion of the base fin layer through selective condensation, in accordance with an embodiment of the present invention.

FIG. 9 is a cross-sectional side view of the long axis of the vertical fin showing a protective segment formed on a condensed protruding portion of the base fin layer through selective condensation, in accordance with an embodiment of the present invention.

In one or more embodiments, a protective segment 210 can be formed on a condensed protruding portion 200 of the base fin layer 135 through selective condensation of the condensation layer 190. The condensation layer 190 and protruding portion of the base fin layer can go through a condensation reaction to form the protective segment 210 and change the chemical composition of the protruding portions to form condensed protruding portions 200. In a non-limiting exemplary embodiment, a $GeO_2$ condensation layer 190 can react with a SiGe base fin layer 135 to form an $SiO_2$ protective segment 210 selectively on the protruding portions, and increase the germanium concentration of the SiGe protruding portions.

In various embodiments, the condensed protruding portions 200 of the base fin layer 135 can have a germanium concentration in a range of about 60 at. % Ge to about 100 at. % Ge, or about 80 at. % Ge to about 100 at. % Ge, where the final condensed germanium concentration is greater than the initial germanium concentration.

Figure 10:
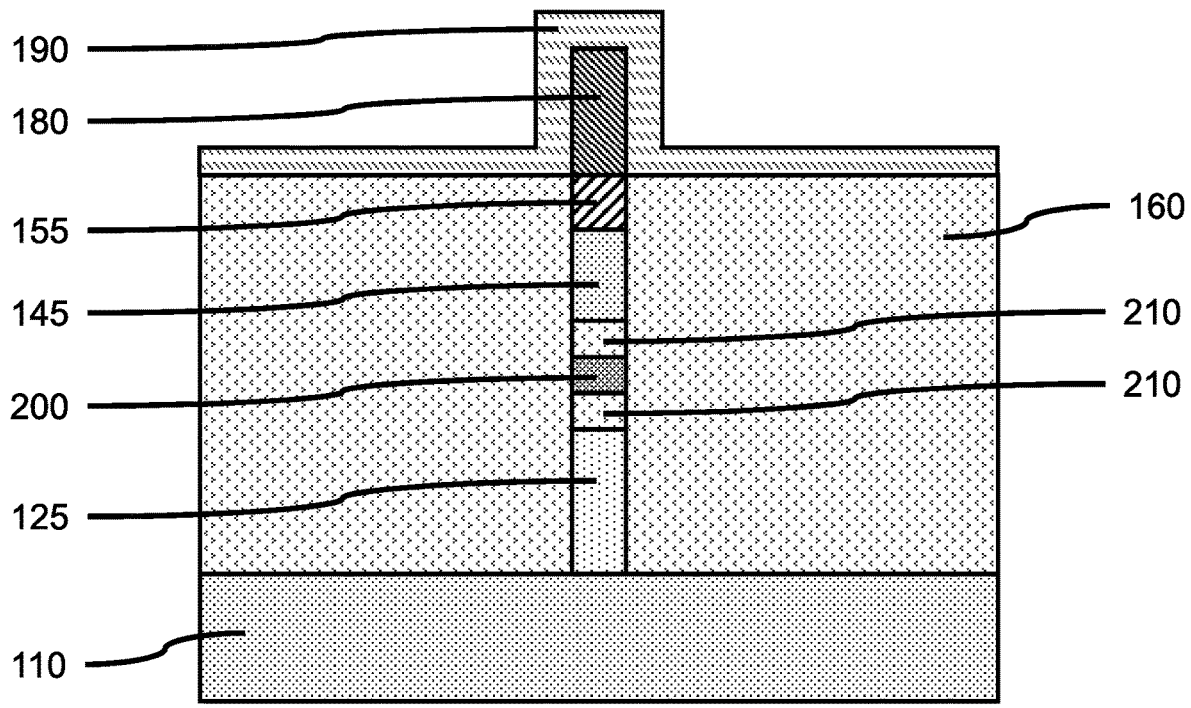
FIG. 10 is a cross-sectional side view, perpendicular to FIG. 9, showing the condensation layer on the surfaces of the contact spacer and fill layer, and the protective segment formed on the condensed protruding portion of the base fin layer, in accordance with an embodiment of the present invention.

FIG. 10 is a cross-sectional side view, perpendicular to FIG. 9, showing the condensation layer on the surfaces of the contact spacer and fill layer, and the protective segment formed on the condensed protruding portion of the base fin layer, in accordance with an embodiment of the present invention.

In one or more embodiments, the condensation layer 190 can be on the fill layer 160 and contact spacers 180.

Figure 11:
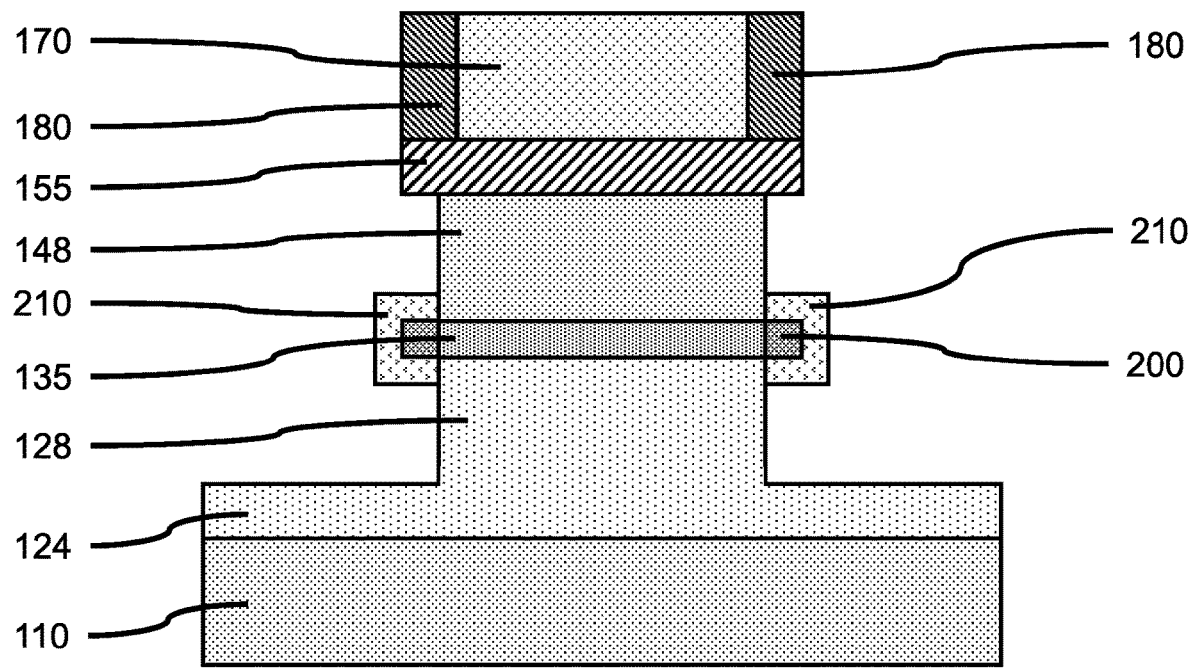
FIG. 11 is a cross-sectional side view of the long axis of the vertical fin showing the recessed emitter fin layer and recessed collector fin layer exposed after removing the remaining portion of the condensation layer, in accordance with an embodiment of the present invention.

FIG. 11 is a cross-sectional side view of the long axis of the vertical fin showing the recessed emitter fin layer and recessed collector fin layer exposed after removing the remaining portion of the condensation layer, in accordance with an embodiment of the present invention.

In one or more embodiments, the condensation layer 190 can be removed from the surfaces of the contact spacers 180, dummy emitter contact 170, fin template 155, recessed emitter fin layer 148, recessed collector fin layer 128, and reduced first doped semiconductor layer 124 using a selective isotropic etch. The protective segment 210 can remain on the condensed protruding portions 200.

Figure 12:
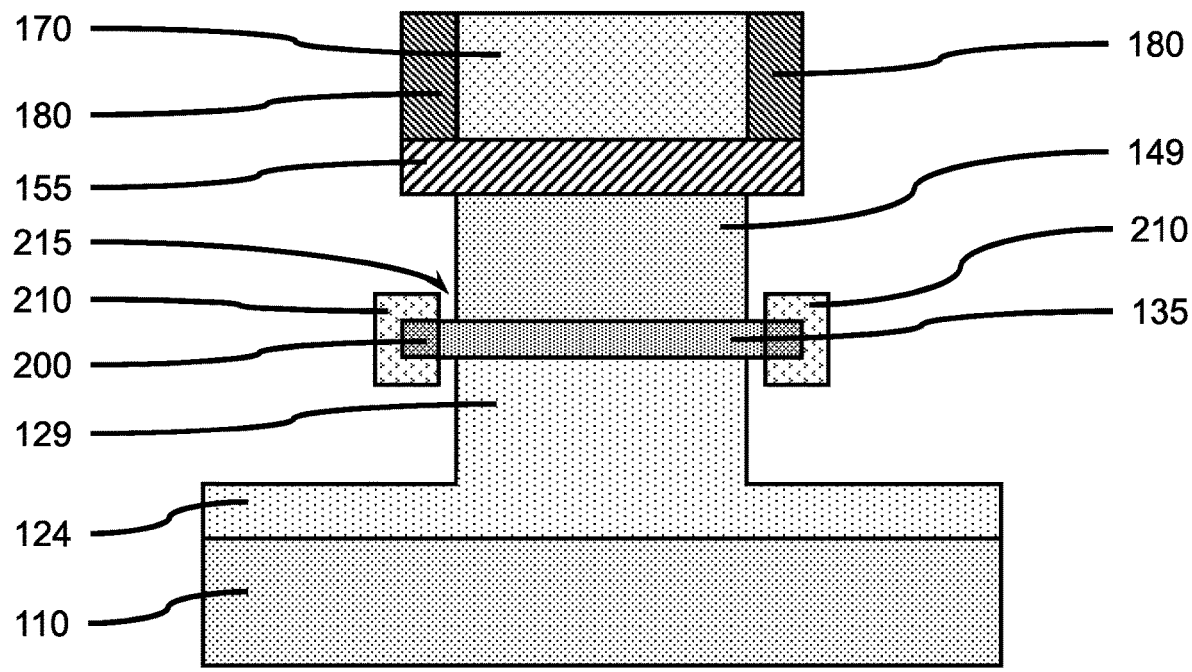
FIG. 12 is a cross-sectional side view of the long axis of the vertical fin showing the shortened emitter fin layer and shortened collector fin layer after additional recessing to form grooves, in accordance with an embodiment of the present invention.

FIG. 12 is a cross-sectional side view of the long axis of the vertical fin showing the shortened emitter fin layer and shortened collector fin layer after additional recessing to form grooves, in accordance with an embodiment of the present invention.

In one or more embodiments, the recessed emitter fin layer 148 and recessed collector fin layer 128 can be further shortened using a second isotropic etch to form a shortened emitter fin layer 149 and a shortened collector fin layer 129. The removal of a portion of the end walls of the recessed emitter fin layer 148 and recessed collector fin layer 128 can form a groove 215 between the protective segment 210 and the end walls of the shortened emitter fin layer 149 and shortened collector fin layer 129. The groove can be above and below the base fin layer 135 and expose a portion of the base fin layer 135 adjacent to the condensed protruding portions 200.

In various embodiments, the recessed emitter fin layer 148 and recessed collector fin layer 128 can be shortened by a distance in a range of about 5 nm to about 50 nm to form grooves with a width of the same distance. The height of the reduced first doped semiconductor layer 124 can also be further reduced by about the same amount as the second isotropic etch and groove distance.

Figure 13:
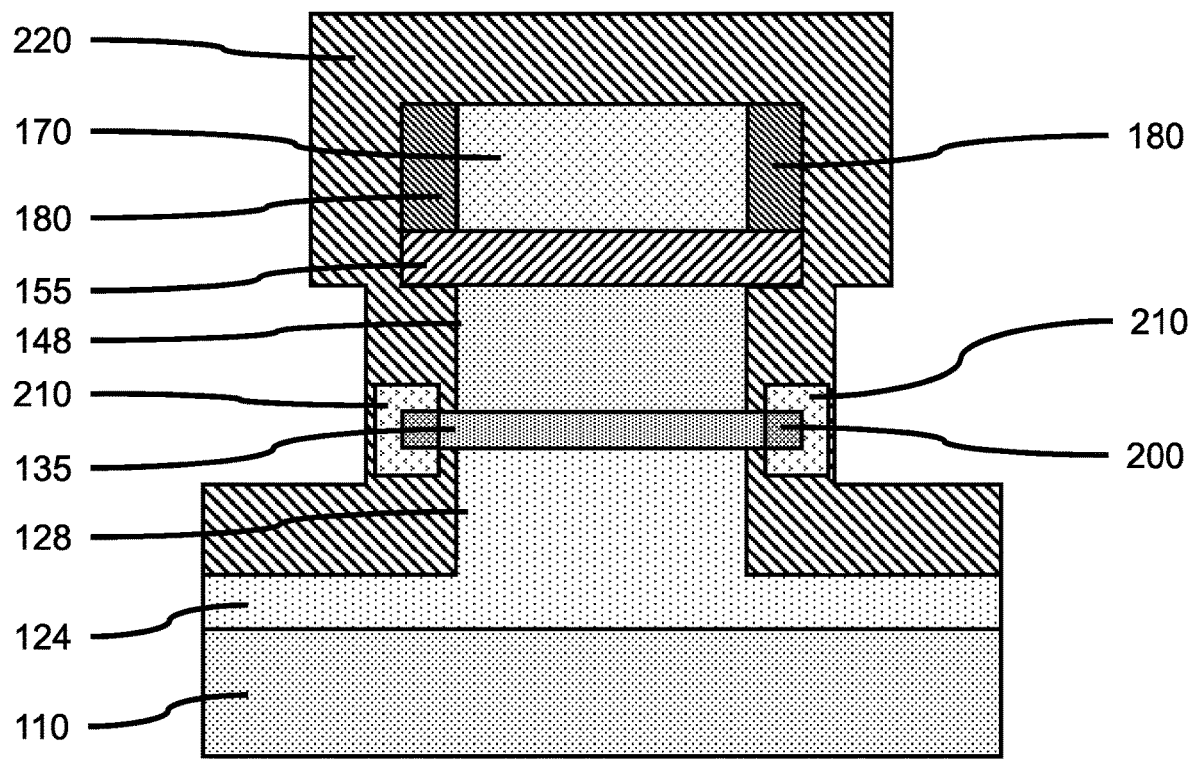
FIG. 13 is a cross-sectional side view showing a spacer layer formed in the grooves and on the exposed surfaces of the base fin layer, shortened emitter fin layer, shortened collector fin layer, dummy emitter contact and contact spacers, and reduced height first doped semiconductor layer, in accordance with an embodiment of the present invention.

FIG. 13 is a cross-sectional side view showing a spacer layer formed in the grooves and on the exposed surfaces of the base fin layer, shortened emitter fin layer, shortened collector fin layer, dummy emitter contact and contact spacers, and reduced height first doped semiconductor layer, in accordance with an embodiment of the present invention.

In one or more embodiments, a spacer layer 220 can be formed in the grooves 215 and on the exposed surfaces of the base fin layer 135, shortened emitter fin layer 149, shortened collector fin layer 129, contact spacers 180, dummy emitter contact 170, fin template 155, and reduced first doped semiconductor layer 124. The spacer layer 220 can be formed by a conformal deposition (e.g., ALD, PEALD), where the spacer layer 220 can be formed to a predetermined thickness that is sufficient to fill in the grooves and cover the protective segments 210.

In various embodiments, the spacer layer 220 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. The spacer layer 220 can be a different material from the contact spacers 180 and dummy emitter contact 170 to allow selective removal.

Figure 14:
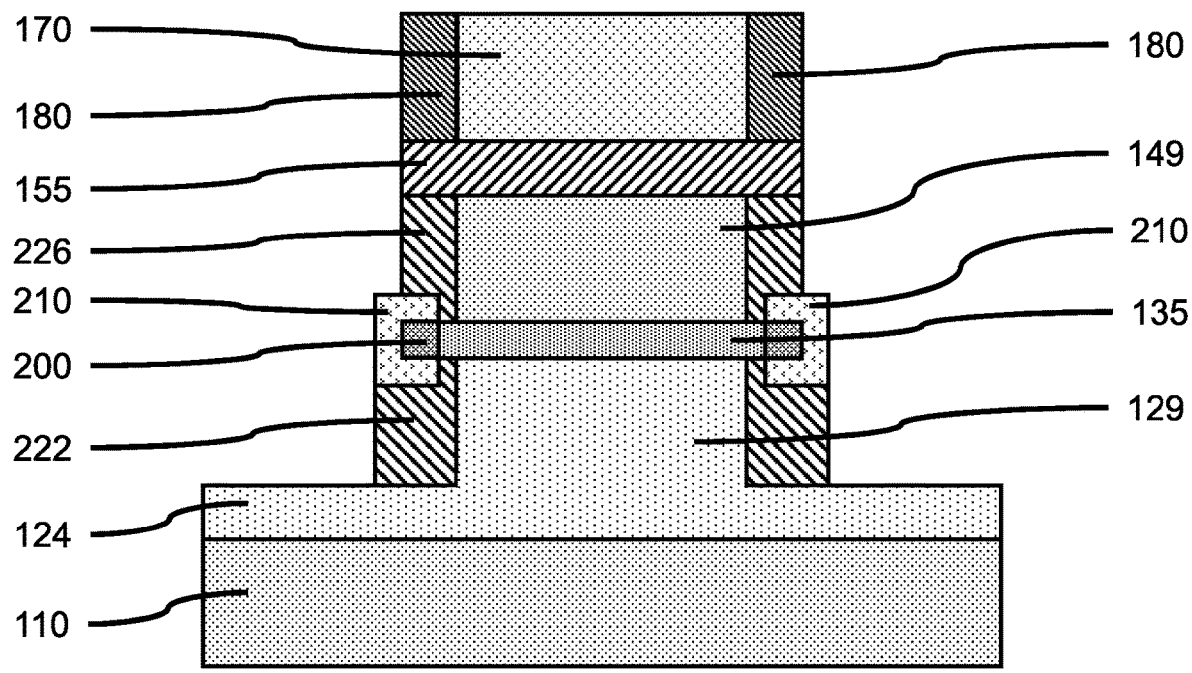
FIG. 14 is a cross-sectional side view showing spacers formed in the grooves and on the exposed surfaces of the base fin layer and shortened emitter fin layer, in accordance with an embodiment of the present invention.

FIG. 14 is a cross-sectional side view showing spacers formed in the grooves and on the exposed surfaces of the shortened base fin layer and shortened emitter fin layer, in accordance with an embodiment of the present invention.

In one or more embodiments, exposed portions of the spacer layer 220 can be removed using a selective, directional etch (e.g., RIE) to form an upper spacer 226 and lower spacer 222 in the grooves 215 and adjoining the shortened emitter fin layer 149 and a shortened collector fin layer 129. In various embodiments, the lower spacer 222 can be wider than the upper spacer 226 due to the masking effect of the protruding aspect of the protective segment 210 compared to the fin template 155.

Figure 15:
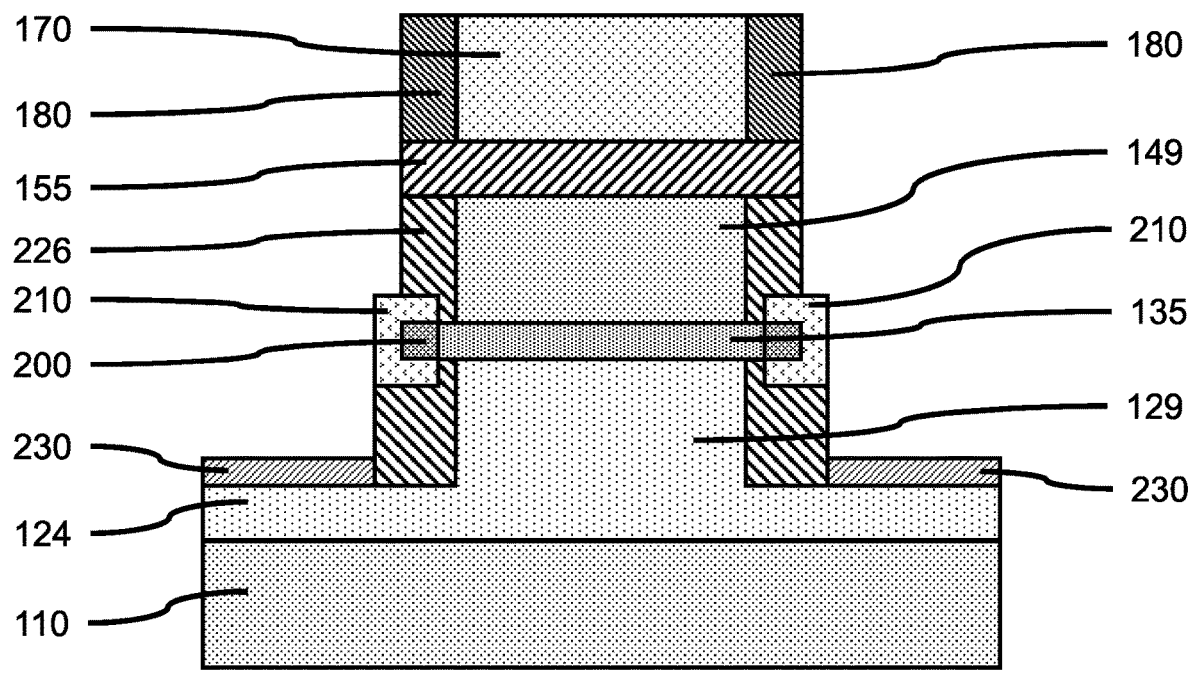
FIG. 15 is a cross-sectional side view showing a bottom spacer layer formed on the reduced height first doped semiconductor layer and doped substrate, in accordance with an embodiment of the present invention.

FIG. 15 is a cross-sectional side view showing a bottom spacer layer formed on the reduced height first doped semiconductor layer and doped substrate, in accordance with an embodiment of the present invention.

In one or more embodiments, a bottom spacer layer 230 can be formed on the reduced first doped semiconductor layer 124, where the bottom spacer layer can be formed by a directional deposition, for example, a high density plasma (HDP) deposition or gas cluster ion beam (GCIB) deposition. In various embodiments, the bottom spacer layer 230 can be a dielectric material, where the bottom spacer layer 230 can be the same dielectric material as the upper spacer 226 and lower spacer 222.

Figure 16:
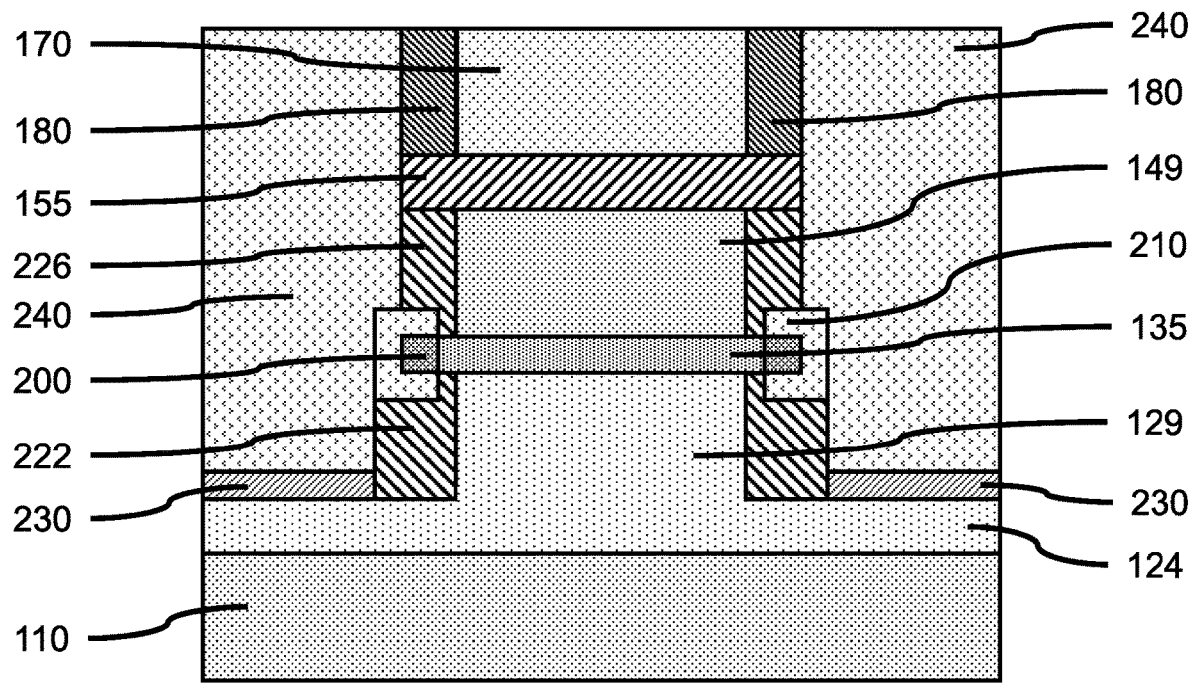
FIG. 16 is a cross-sectional side view showing an interlayer dielectric (ILD) layer formed on the bottom spacer layer and the protective segment, in accordance with an embodiment of the present invention.

FIG. 16 is a cross-sectional side view showing an interlayer dielectric (ILD) layer formed on the bottom spacer layer and the protective segment, in accordance with an embodiment of the present invention.

In one or more embodiments, an interlayer dielectric (ILD) layer 240 can be formed on the bottom spacer layer 230 and the protective segment 210, where the ILD layer can be formed by a blanket deposition. In various embodiments the ILD layer 240 can be a dielectric material, including, but not limited to, silicon oxide (SiO) or a low-k material.

Figure 17:
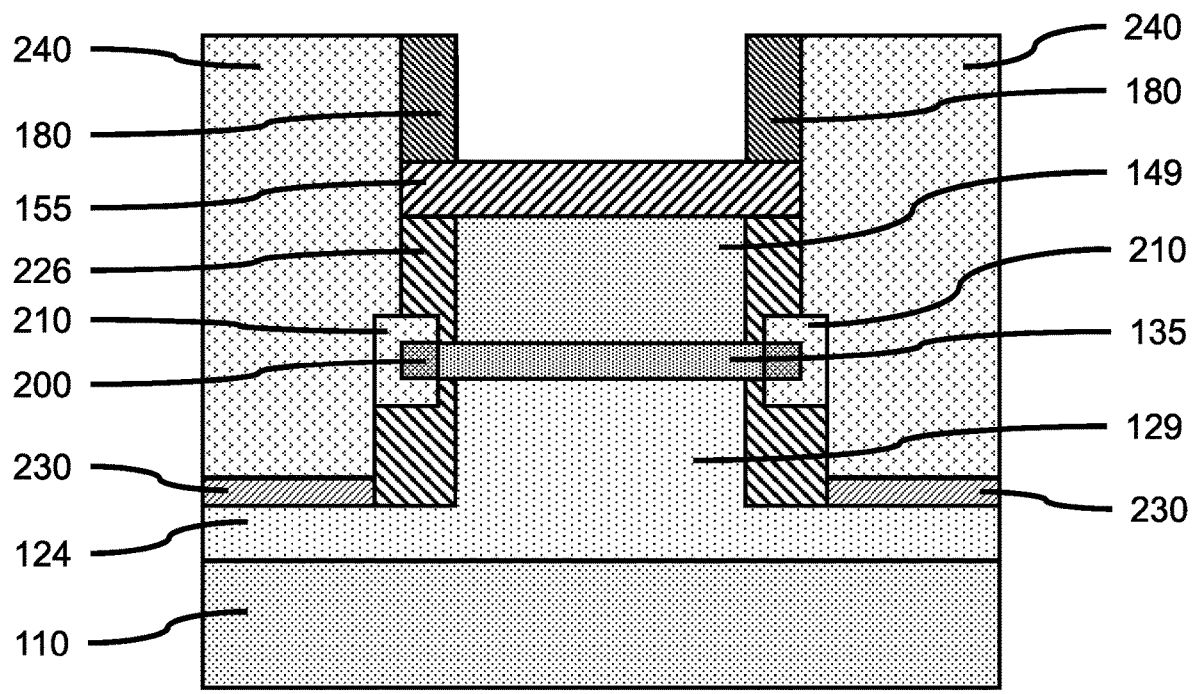
FIG. 17 is a cross-sectional side view showing the dummy emitter contact removed to expose the fin template, in accordance with an embodiment of the present invention.

FIG. 17 is a cross-sectional side view showing the dummy emitter contact removed to expose the fin template, in accordance with an embodiment of the present invention.

In one or more embodiments, the dummy emitter contact 170 can be removed from the fin template 155 between the contact spacers 180 using a selective isotropic or directional etch, or both.

Figure 18:
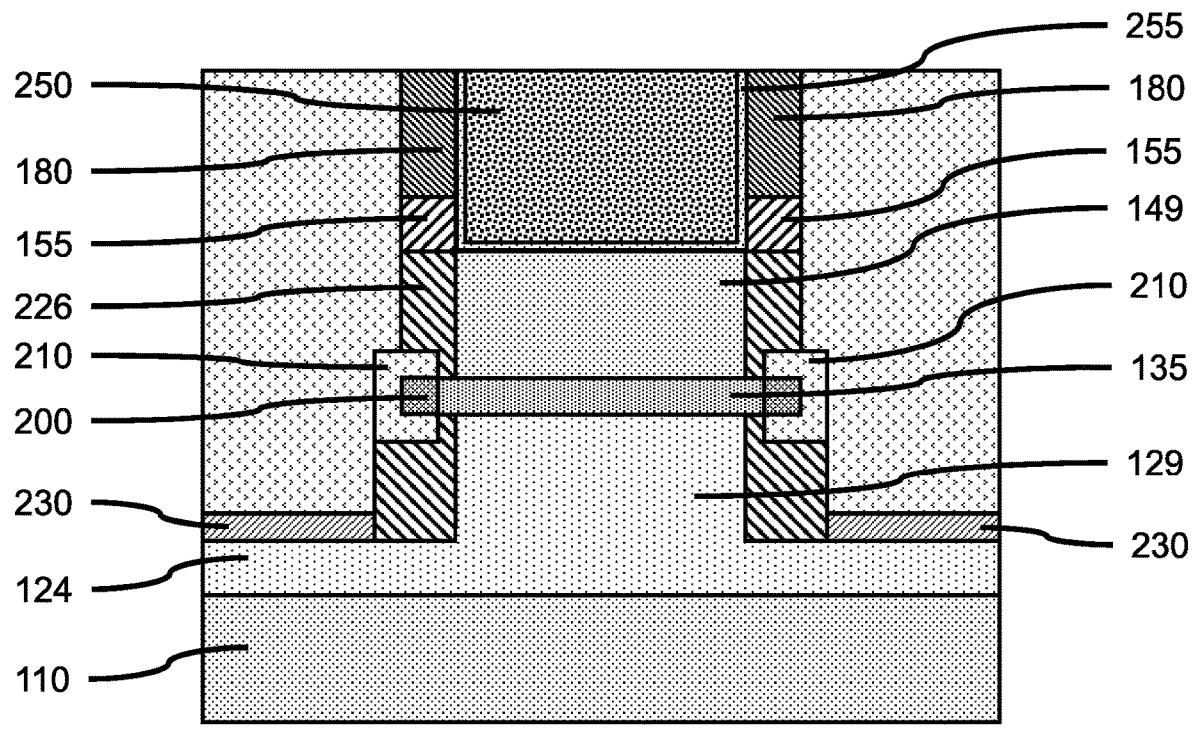
FIG. 18 is a cross-sectional side view showing the exposed portion of the fin template removed to expose the shortened emitter fin layer, and an emitter contact formed between the contact spacers, in accordance with an embodiment of the present invention.

FIG. 18 is a cross-sectional side view showing the exposed portion of the fin template removed to expose the shortened emitter fin layer, and an emitter contact formed between the contact spacers, in accordance with an embodiment of the present invention.

In one or more embodiments, an exposed portion of the fin template 155 can be removed using a selective directional etch (e.g., RIE) to expose the underlying shortened emitter fin layer 149. In various embodiments, an emitter contact 250 can be formed on the exposed shortened emitter fin layer 149 between the contact spacers 180. The emitter contact 250 can be formed by a conformal deposition or metal-organic CVD (MOCVD). In various embodiment, the emitter contact 250 can be a conductive material, for example, a metal including, but not limited to, tungsten (W), aluminum (Al), or copper (Cu), cobalt (Co), nickel (Ni), titanium (Ti), ruthenium (Ru).

In various embodiments, a liner 255 can be formed on the inner walls of the contact spacers 180, fin template 155, and on the exposed surface of the shortened emitter fin layer 149, where the liner can be a diffusion barrier to the material of the emitter contact 250. The liner can be a conductive material, for example, titanium nitride (TiN), tantalum nitride (TaN), hafnium nitride (HfN), niobium nitride (NbN), tungsten nitride (WN), tungsten carbon nitride (WCN), tungsten (W), cobalt (Co), polysilicon doped with phosphorus, arsenic, or boron to a concentration of about $1 \times 10^{19}/cm^3$, or combinations thereof.

Figure 19:
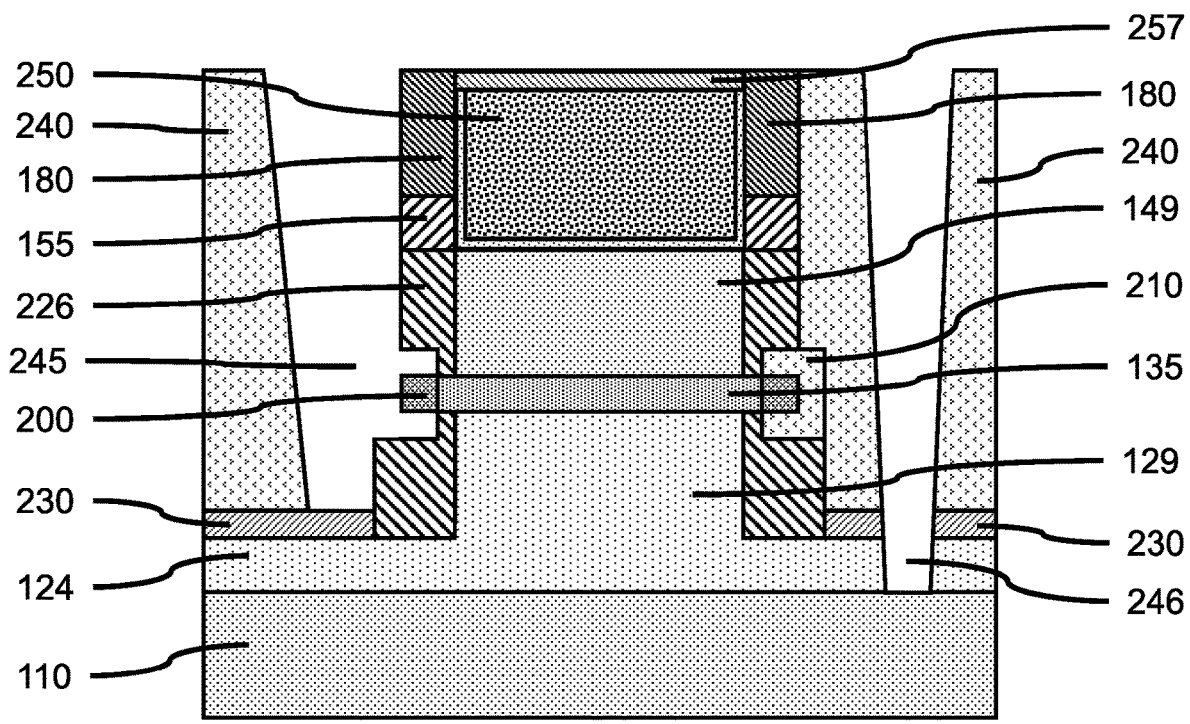
FIG. 19 is a cross-sectional side view showing trenches formed in the interlayer dielectric (ILD) layer, and the protective segment removed from part of the condensed protruding portion, in accordance with an embodiment of the present invention.

FIG. 19 is a cross-sectional side view showing trenches formed in the interlayer dielectric (ILD) layer, and the protective segment removed from part of the condensed protruding portion, in accordance with an embodiment of the present invention.

In one or more embodiments, an upper portion of the emitter contact 250 and liner 255 can be removed, and an emitter contact cap 257 can be formed on the emitter contact 250, where the emitter contact cap 257 can be a dielectric material formed by a blanket deposition, and a chemical-mechanical polishing (CMP) used to removed emitter contact cap material from the ILD layer 240.

In one or more embodiments, a first trench 245 can be formed in the interlayer dielectric (ILD) layer 240 adjacent to the contact spacers 180, fin template 155, upper spacer 226, lower spacer 222, and condensed protruding portions 200, where the condensed protruding portions 200 is exposed to form a base contact. The ILD layer 240 can be the same material as the protective segment 210, so the ILD layer 240 and protective segment 210 can be removed at the same time.

In various embodiments, a second trench 246 can be formed in the ILD layer 240 down to the first doped semiconductor layer 110 to form a collector contact.

Figure 20:
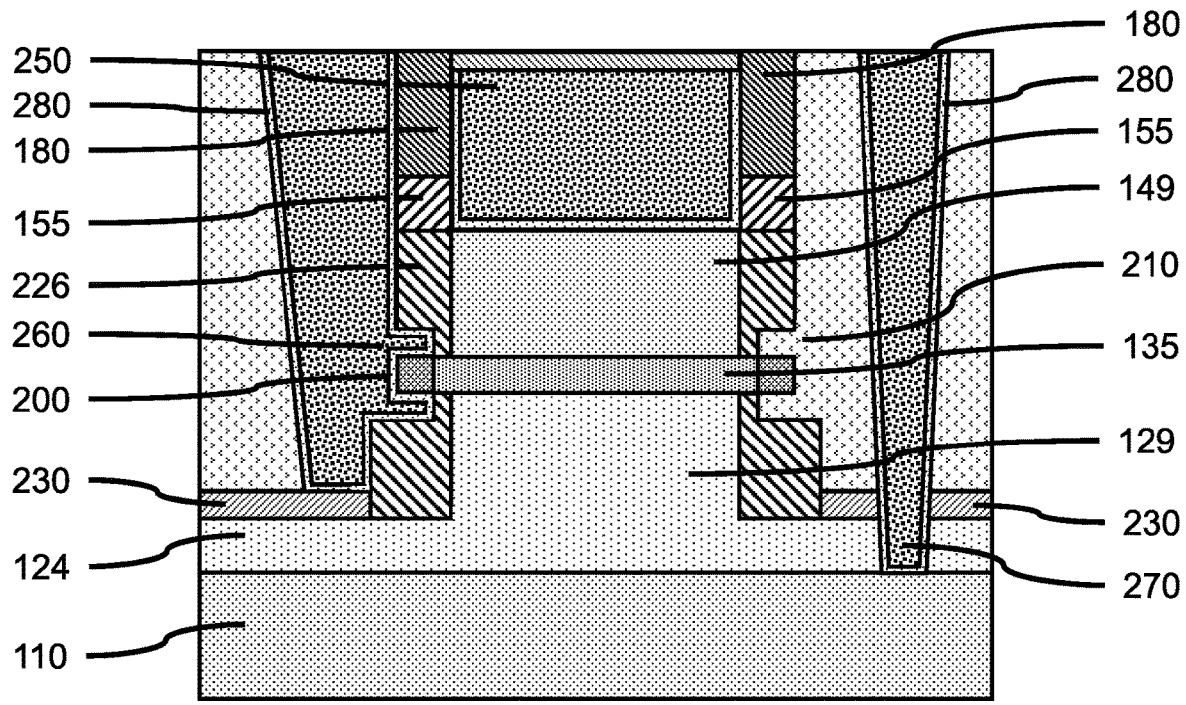
FIG. 20 is a cross-sectional side view showing a base contact and a collector contact formed in the trenches, in accordance with an embodiment of the present invention.

FIG. 20 is a cross-sectional side view showing a base contact and a collector contact formed in the trenches, in accordance with an embodiment of the present invention.

In one or more embodiments, a base contact 260 can be formed in the first trench 245, and a collector contact 270 can be formed in the second trench 246, where the base contact 260 and collector contact 270 can be formed at the same time, for example, by a conformal deposition.

In various embodiment, the base contact 260 and collector contact 270 can be a conductive material, for example, a metal including, but not limited to, tungsten (W), aluminum (Al), or copper (Cu), cobalt (Co), nickel (Ni), titanium (Ti), ruthenium (Ru), tantalum nitride (TaN), titanium nitride (TiN), and combinations thereof.

In various embodiments, a contact liner 280 can be formed on the inner walls of the first trench 245 and/or second trench 246, where the liner can be a diffusion barrier to the material of the base contact 260 and/or collector contact 270. The liner can be a conductive material, for example, titanium nitride (TiN), tantalum nitride (TaN), hafnium nitride (HfN), niobium nitride (NbN), tungsten nitride (WN), tungsten carbon nitride (WCN), or combinations thereof.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a silicon-germanium heterojunction bipolar transistor (HBT) device, comprising:
   forming a stack of four doped semiconductor layers on a semiconductor substrate;
   forming a dummy emitter contact and contact spacers on a fourth doped semiconductor layer of the stack of four doped semiconductor layers;
   removing portions of the second, third, and fourth semiconductor layers to form a vertical fin;
   recessing the second doped semiconductor layer and fourth doped semiconductor layer;
   depositing a condensation layer on the exposed surfaces of the second doped semiconductor layer, third doped semiconductor layer, and fourth doped semiconductor layer; and
   reacting the condensation layer with the third doped semiconductor layer to form a protective segment on a condensed protruding portion of the third doped semiconductor layer.

2. The method of claim 1, wherein the material of the first doped semiconductor layer is silicon, the material of the second doped semiconductor layer is silicon, the material of the third doped semiconductor layer is silicon-germanium, and the material of the fourth doped semiconductor layer is silicon.

3. The method of claim 2, wherein the first doped semiconductor layer includes an n-type dopant, the second doped semiconductor layer includes an n-type dopant, the third doped semiconductor layer includes a p-type dopant, and the fourth doped semiconductor layer includes an n-type dopant.

4. The method of claim 2, wherein the condensation layer is germanium oxide (GeO).

5. The method of claim 4, wherein the protective segment is silicon oxide (SiO).

6. The method of claim 4, wherein the material of the condensed protruding portion is silicon-germanium (SiGe) with a higher germanium (Ge) concentration than the third doped semiconductor layer.

7. The method of claim 4, further comprising removing the condensation layer from the second doped semiconductor layer and fourth doped semiconductor layer.

8. The method of claim 7, further comprising further recessing the second doped semiconductor layer and fourth doped semiconductor layer to form a groove between the protective segment and the second doped semiconductor layer and fourth doped semiconductor layer.

9. The method of claim 8, further comprising removing at least a portion of the protective segment to expose at least a portion of the condensed protruding portion.

10. A method of forming a silicon-germanium heterojunction bipolar transistor (HBT) device, comprising:

forming a first doped semiconductor layer on a semiconductor substrate;

forming a second doped semiconductor layer on the first doped semiconductor layer, wherein the material of the second doped semiconductor layer is silicon;

forming a third doped semiconductor layer on the second doped semiconductor layer, wherein the material of the third doped semiconductor layer is silicon-germanium;

forming a fourth doped semiconductor layer on the third doped semiconductor layer, wherein the material of the fourth doped semiconductor layer is silicon;

forming a dummy emitter contact and contact spacers on the fourth doped semiconductor layer;

removing portions of the first, second, third, and fourth semiconductor layers to form a vertical fin;

recessing the second doped semiconductor layer and fourth doped semiconductor layer;

depositing a condensation layer on the exposed surfaces of the second doped semiconductor layer, third doped semiconductor layer, and fourth doped semiconductor layer;

reacting the condensation layer with the third doped semiconductor layer to form a protective segment on a condensed protruding portion of the third doped semiconductor layer; and removing the condensation layer from the second doped semiconductor layer and fourth doped semiconductor layer.

11. The method of claim 10, wherein the condensation layer is germanium oxide (GeO).

12. The method of claim 11, wherein the protective segment is silicon oxide (SiO).

13. The method of claim 12, wherein the material of the condensed protruding portion is silicon-germanium (SiGe) with a higher germanium (Ge) concentration than the third doped semiconductor layer.

14. The method of claim 13, wherein the condensation layer has a thickness in a range of about 2 nm to about 6 nm.

* * * * *